(12) United States Patent
Kim

(10) Patent No.: US 11,790,975 B2
(45) Date of Patent: Oct. 17, 2023

(54) MEMORY CONTROLLER AND MEMORY SYSTEM

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 5 days.

(21) Appl. No.: 17/536,803

(22) Filed: Nov. 29, 2021

(65) Prior Publication Data
US 2022/0189535 A1 Jun. 16, 2022

Related U.S. Application Data

(60) Provisional application No. 63/123,666, filed on Dec. 10, 2020.

(30) Foreign Application Priority Data

Feb. 26, 2021 (KR) .................... 10-2021-0026556

(51) Int. Cl.
*G11C 7/04* (2006.01)
*G11C 11/406* (2006.01)
*G11C 11/4076* (2006.01)

(52) U.S. Cl.
CPC ........ *G11C 11/40615* (2013.01); *G11C 7/04* (2013.01); *G11C 11/4076* (2013.01); *G11C 11/40622* (2013.01)

(58) Field of Classification Search
CPC ........................................... G11C 7/04
USPC ............................................. 365/222
See application file for complete search history.

(56) References Cited

U.S. PATENT DOCUMENTS

| 10,410,710 B2 | 9/2019 | Lee | |
| 2014/0059287 A1* | 2/2014 | Bains | G11C 7/02 |
| | | | 711/106 |
| 2018/0342282 A1* | 11/2018 | Morgan | G11C 11/4078 |
| 2019/0228813 A1 | 7/2019 | Nale et al. | |
| 2023/0101739 A1* | 3/2023 | You | G11C 11/408 |
| | | | 365/222 |

* cited by examiner

*Primary Examiner* — Muna A Techane
(74) *Attorney, Agent, or Firm* — IP & T GROUP LLP

(57) ABSTRACT

A memory controller includes: a security level setting circuit suitable for setting a security level by monitoring a risk of a row hammer attack; and a refresh management command control circuit suitable for controlling the number of times that a refresh management command is to be applied to a memory per unit time according to the security level.

20 Claims, 4 Drawing Sheets

MEMORY CONTROLLER AND MEMORY SYSTEM

CROSS-REFERENCE TO RELATED APPLICATIONS

The present application claims the benefit of U.S. Provisional Application No. 63/123,666, filed on Dec. 10, 2020, and priority to Korean Patent Application No. 10-2021-0026556, filed on Feb. 26, 2021, which are both incorporated herein by reference in their entirety.

BACKGROUND

1. Field

Various embodiments of the present invention relate to a memory system.

2. Description of the Related Art

As the degree of integration of a memory increases, the spacing between a plurality of word lines included in the memory decreases. As the spacing between word lines decreases, the coupling effect between the neighboring word lines increases.

Whenever data is input or output to or from a memory cell, a word line toggles between an active state and an inactive state. As the coupling effect between the neighboring word lines increases, the data in the memory cell coupled to a word line which is disposed adjacent to a frequently activated word line may be damaged. This phenomenon is referred to as row hammering. Since the data of a memory cell is damaged before the memory cell is refreshed due to word line disturbance, there is a concern.

FIG. 1 is a schematic diagram illustrating a portion of a cell array included in a memory device to describe row hammering.

In FIG. 1, 'WLL' may correspond to a frequently activated word line, and 'WLL-1' and 'WLL+1' may be word lines disposed adjacent to 'WLL', that is, word lines disposed adjacent to the frequently activated word line. 'CL' may correspond to a memory cell coupled to 'WLL', and 'CL-1' may be a memory cell coupled to 'WLL-1', and 'CL+1' may be a memory cell coupled to 'WLL+1'. Each memory cell may include a cell transistor TL, TL-1, or TL+1 and a cell capacitor CAPL, CAPL-1, or CAPL+1.

In FIG. 1, when 'WLL' is activated or deactivated, the voltages of 'WLL-1' and 'WLL+1' may increase or decrease due to the coupling effect that occurs between 'WLL', 'WLL-1', and 'WLL+1', affecting the amount of charges in the cell capacitors CL-1 and CL+1. Therefore, when 'WLL' is frequently activated and 'WLL' toggles between an activated state and a deactivated state, variation in the amount of charges stored in the cell capacitors CAPL-1 and CAPL+1 included in the 'CL-1' and 'CL+1' becomes large, and the data in the memory cell may be deteriorated.

The electromagnetic wave generated when a word line toggles between the activated state and the deactivated state may damage the data stored in a cell capacitor of a memory cell coupled to a neighboring word line by charging electrons into the cell capacitor of the memory cell coupled to the neighboring word line or discharging the electrons from the cell capacitor.

As a method for solving the issue of row hammering, a method of detecting a row that has been activated several times and refreshing the neighboring rows of the row that has been activated several times may be used.

SUMMARY

Embodiments of the present invention are directed to a technique for increasing low hammering attack defense capability of a memory system.

In accordance with an embodiment of the present invention, a memory controller includes: a security level setting circuit suitable for setting a security level by monitoring a risk of a row hammer attack; and a refresh management command control circuit suitable for controlling the number of times that a refresh management command is to be applied to a memory per unit time according to the security level.

In accordance with another embodiment of the present invention, a memory controller includes: a security level setting circuit suitable for setting a security level by monitoring a risk of a row hammer attack; and a normal refresh command control circuit suitable for controlling the number of times that a refresh command is to be applied to a memory per unit time according to the security level.

In accordance with yet another embodiment of the present invention, a memory system includes: a memory; and a memory controller suitable for controlling the memory, wherein the memory controller includes: a security level setting circuit suitable for setting a security level by monitoring a risk of a row hammer attack; and a refresh management command control circuit suitable for controlling the number of times that a refresh management command is to be applied to the memory per unit time according to the security level.

In accordance with still another embodiment of the present invention, a memory system includes: a memory; and a memory controller suitable for controlling the memory, wherein the memory controller includes: a security level setting circuit suitable for setting a security level by monitoring a risk of a row hammer attack; and a normal refresh command control circuit suitable for controlling the number of times that a refresh command is to be applied to the memory per unit time according to the security level.

In accordance with still another embodiment of the present invention, a memory system includes: a memory; and a memory controller coupled to the memory and including a row hammer correspondence block configured to: receive active information, cache miss information, and uncorrectable error information, which are associated with an operation on the memory; monitor probability of a row hammering on the memory based on at least one of the received information; determine a security level based on the probability of the row hammering; and apply, to the memory, a command including at least one of a refresh command and a refresh management command, wherein a rate of applying of the command is determined based on the security level.

DETAILED DESCRIPTION

Figure 1:
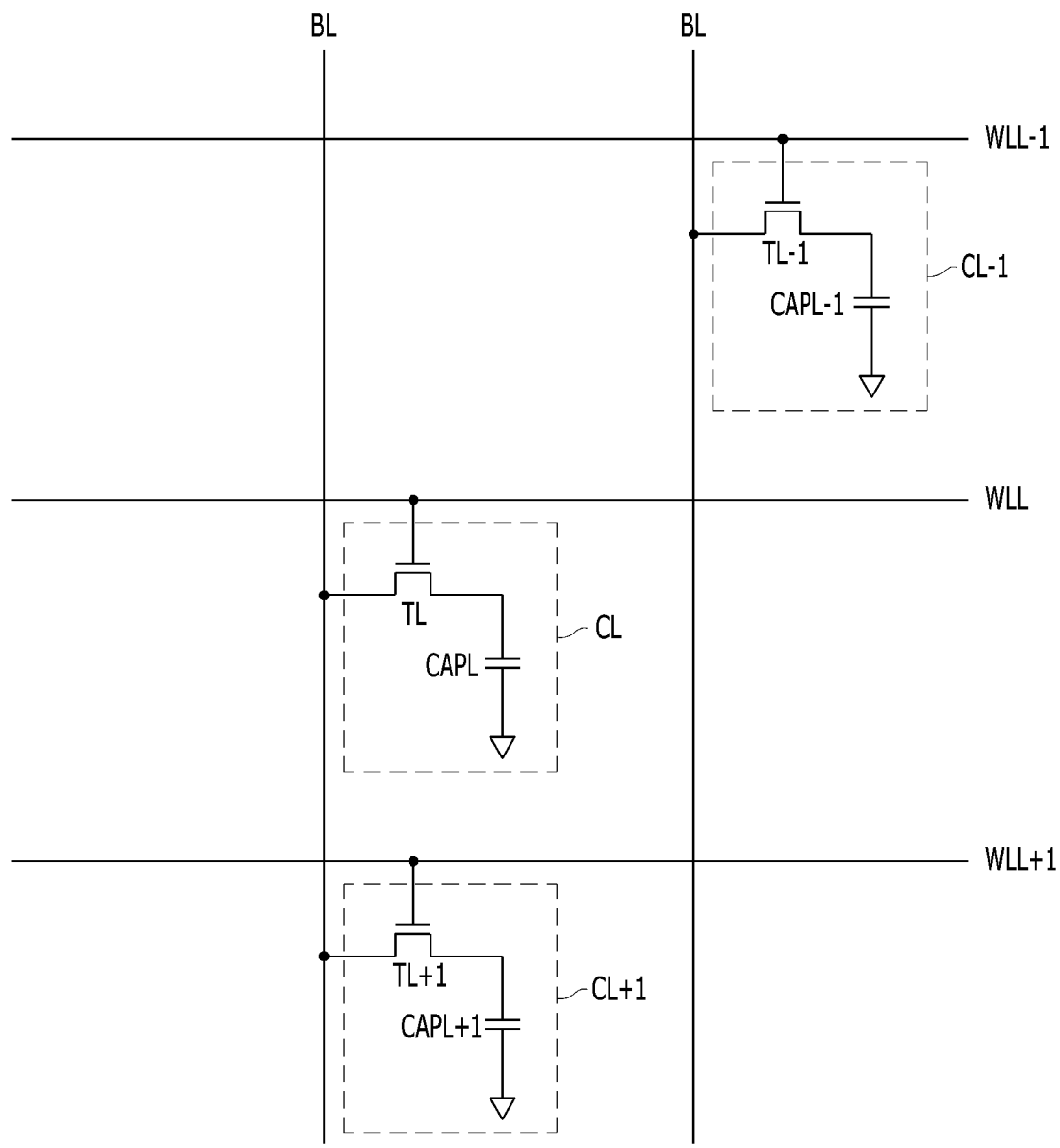
FIG. 1 is a schematic diagram illustrating a portion of a cell array included in a memory device to describe row hammering.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
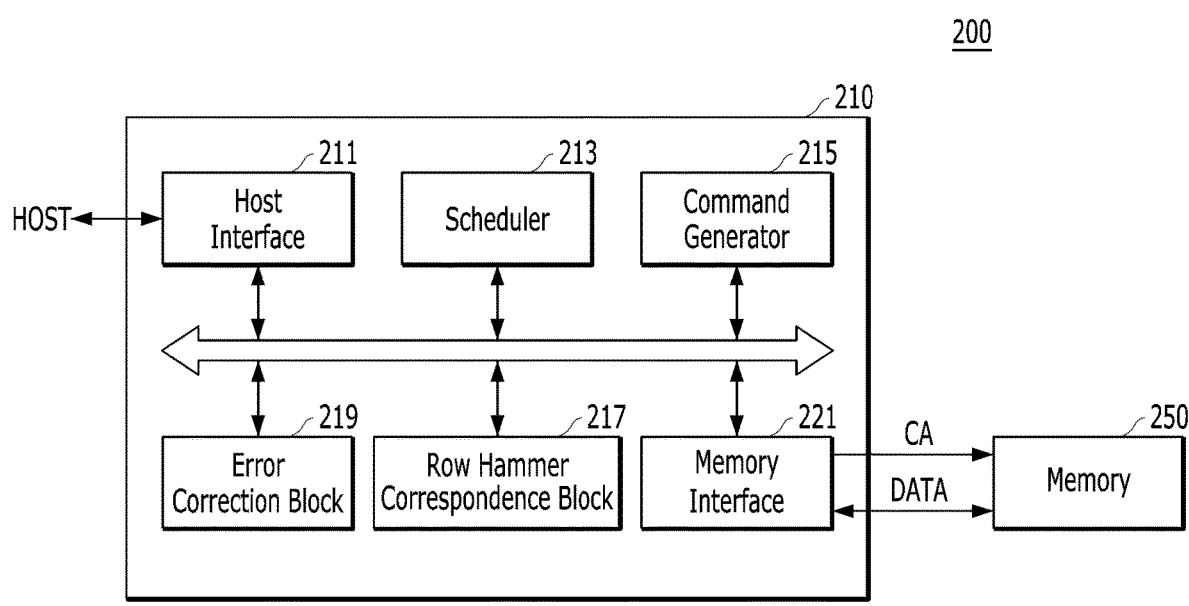
FIG. 2 is a block diagram illustrating a memory system in accordance with an embodiment of the present invention.

FIG. 2 is a block diagram illustrating a memory system 200 in accordance with an embodiment of the present invention.

Referring to FIG. 2, the memory system 200 may include a memory controller 210 and a memory 250.

The memory controller 210 may control the operation of the memory 250 according to a request from a host HOST. The host HOST may include a Central Processing Unit (CPU), a Graphic Processing Unit (GPU), an Application Processor (AP), and the like. The memory controller 210 may include a host interface 211, a scheduler 213, a command generator 215, a row hammer correspondence block 217, an error correction block 219, and a memory interface 221. The memory controller 210 may be included in a CPU, GPU, AP, etc. In this case, the host HOST may mean a structure other than the memory controller 210 in these structures. For example, when the memory controller 210 is included in a CPU, the host HOST may represent the remaining constituent elements except for the memory controller 210 in the CPU. The memory controller 210, host interface 211, scheduler 213, command generator 215, row hammer correspondence block 217, error correction block 219, and memory interface 221 may include all circuits, systems, software, firmware and devices necessary for their respective operations and functions.

The host interface 211 may be provided for an interface between the memory controller 210 and the host HOST.

The scheduler 213 may determine the order of requests to be commanded to the memory 250 among the requests from the host HOST. The scheduler 213 may make the order in which requests are received from the host HOST different from the order of the operations to be commanded to the memory 250 in order to improve the performance of the memory 250. For example, even though the host HOST requests a read operation of the memory 250 first and then requests a write operation later, the order may be adjusted in such a manner that the write operation is performed before the read operation.

The scheduler 213 may schedule a refresh operation, that is, application of a refresh command, between the operations requested from the host HOST in order to prevent the data in the memory 250 from being lost. Also, the scheduler 213 may schedule a refresh management operation RFM, that is, application of a refresh management command, in order to cope with a row hammer attack. The number of times that the refresh command is to be applied per unit time (i.e., a rate of applying of the refresh command) and the number of times that the refresh management command is to be applied per unit time (i.e., a rate of applying of the refresh management command) may be determined by the row hammer correspondence block 217. Here, the refresh management operation may refer to an operation of refreshing the rows whose data are highly likely to be lost due to a row hammer attack in a memory.

The command generator 215 may generate a command to be applied to the memory 250 according to the order of the operations determined by the scheduler 213.

The row hammer correspondence block 217 may monitor the risk of the row hammer attack and schedule the number of times that the refresh command is to be applied per unit time and the number of times that the refresh management command is to be applied per unit time. The structure and operation of the row hammer correspondence block 217 will be described later in detail with reference to FIG. 3.

The error correction block 219 may generate an error correction code and perform an error correction operation using the error correction code. The error correction block 219 may generate an error correction code to be written together with write data in the memory 250. Also, the error correction block 219 may correct an error in read data that are read from the memory 250 based on the error correction code which is read together with the read data.

The memory interface 221 may be provided for an interface between the memory controller 210 and the memory 250. A command and an address CA may be transferred from the memory controller 210 to the memory 250 through the memory interface 221, and data DATA may be transferred and received through the memory interface 221. The memory interface 221 may also be referred to as a physical (PHY) interface.

The memory 250 may perform an operation commanded by the memory controller 210. The memory 250 may be a memory requiring a refresh operation. For example, the memory 220 may be a dynamic random access memory (DRAM) or another type of a memory requiring a refresh operation.

Figure 3:
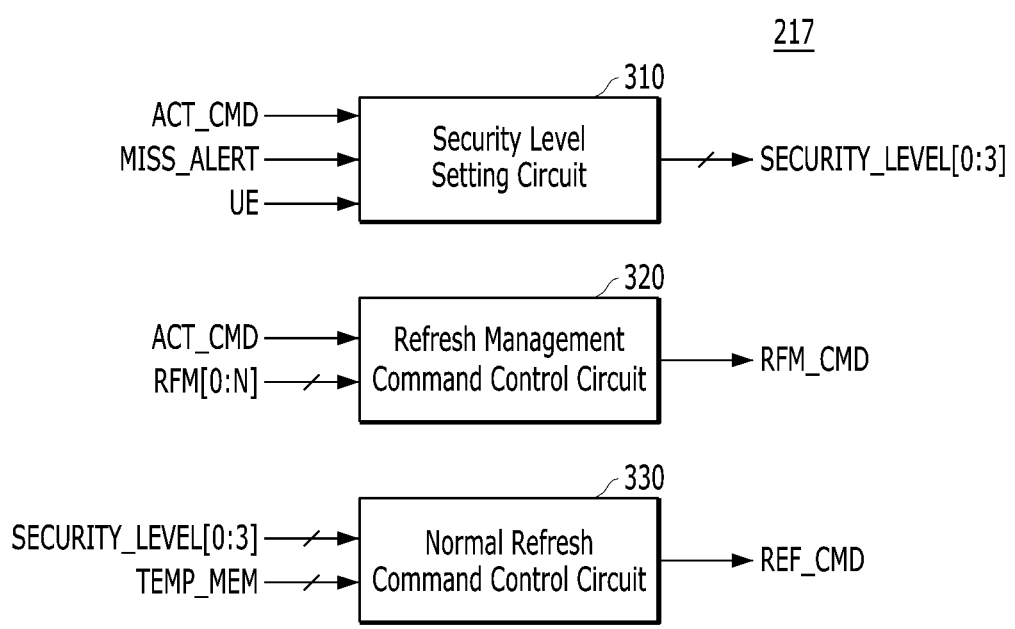
FIG. 3 is a block diagram illustrating a row hammer correspondence block shown in FIG. 2 in accordance with an embodiment of the present invention.

FIG. 3 is a block diagram illustrating the row hammer correspondence block 217 shown in FIG. 2 in accordance with an embodiment of the present invention.

Referring to FIG. 3, the row hammer correspondence block 217 may include a security level setting circuit 310, a refresh management command control circuit 320, and a normal refresh command control circuit 330.

The security level setting circuit 310 may set the security level by monitoring the risk of the row hammer attack. The security level setting circuit 310 may set the security level high when it is determined that the probability of data loss due to the row hammer attack is high, and may set the security level low otherwise. In various embodiments of the present disclosure, the security level setting circuit 310 may monitor active information ACT_CMD, cache miss information MISS_ALERT, and uncorrectable error information UE to grade the risk of the row hammer attack. A security level code SECURITY_LEVEL[0:3] may be a code indicating a set security level. The security level code SECURITY_LEVEL[0:3] may indicate the security level between 0 and 3. For example, when the security level is 0, SECURITY_LEVEL[0] may have a value of '1' and each SECURITY_LEVEL[1:3] may have a value of '0'. Similarly, when the security level is 2, SECURITY_LEVEL[2] may have a value of '1', and each SECURITY_LEVEL[0], [1], and [3] may have a value of '0'.

The security level setting circuit 310 may receive the active information ACT_CMD which is activated whenever an active command is applied to the memory 250. Further, the security level setting circuit 310 may monitor the number of times that the active command is to be applied per unit time, and set the security level higher as the number of times that the active command is to be applied per unit time is higher. When there is a row hammer attack, the characteristic that the number of times that the active command is to be applied per unit time increases is used. The active information ACT_CMD may be provided from the scheduler 213.

Also, the security level setting circuit 310 may receive the cache miss information MISS_ALERT which is activated when a cache miss occurs. Further, the security level setting circuit 310 may monitor the number of times that the cache miss occurs per unit time, and set the security level higher as a cache miss rate becomes higher. This is based on the characteristic that the cache miss rate is increased due to frequent activations when there is a row hammer attack. The cache miss information MISS_ALERT may be received through the host interface 211 from the host HOST including a cache memory.

Also, the security level setting circuit 310 may receive uncorrectable error information UE that is activated when an uncorrectable error occurs. Further, the security level setting circuit 310 may monitor the number of times that the uncorrectable error occurs per unit time, and set the security level higher as the number of times that the uncorrectable error occurs per unit time becomes higher. This is based on the characteristic that the number of errors of the memory 250 increases and the number of uncorrectable errors increases when there is a row hammer attack. The uncorrectable error information UE may be provided from the error correction block 219.

It is illustrated herein that the security level setting circuit 310 sets the security level based on the active information ACT_CMD, the cache miss information MISS_ALERT, and the uncorrectable error information UE. However, the security level setting circuit 310 may be able to set the security level based on only a portion (e.g., one or more) of these information ACT_CMD, MISS_ALERT and UE, and it may also be able to set the security level based on other information except for the information ACT_CMD, MISS_ALERT, and UE.

The refresh management command control circuit 320 may control the number of times that the refresh management command is to be applied to the memory 250 per unit time according to the security level which is set by the security level setting circuit 310. In various embodiments of the present disclosure, the refresh management command control circuit 320 may control the refresh management command to be applied more frequently as the security level is higher. The refresh management command control circuit 320 may control the number of times that the refresh management command is to be applied to the memory 250 per unit time whenever the number of activations, that is, the number of times that the active information ACT_CMD is activated per unit time, reaches a threshold value RFM[0:N]. This threshold value RFM[0:N] may vary according to the security level. The threshold value RFM[0:N] may be received from the memory 250 through the memory interface 221. The memory 250 may transfer the threshold value RFM[0:N] which is determined according to the set security level to the refresh management command control circuit 320. The refresh management command control circuit 320 may activate the refresh management command information RFM_CMD whenever the number of times that the active information ACT_CMD is activated per unit time reaches the threshold value RFM[0:N]. The refresh management command information RFM_CMD may be transferred to the scheduler 213. When the refresh management command information RFM_CMD is activated, the scheduler 213 may schedule the refresh management operation, that is, application of the refresh management command.

Although it is illustrated herein that the refresh management command control circuit 320 receives the threshold value RFM[0:N] from the memory 250, the refresh management command control circuit 320 may not receive the threshold value RFM[0:N] from the memory 250 but may set the threshold value RFM[0:N] differently according to the security level.

The normal refresh command control circuit 330 may control a refresh rate of the refresh command, which is the number of times that the refresh command is to be applied to the memory 250 per unit time, according to the security level which is set by the security level setting circuit 310. The normal refresh command control circuit 330 may increase the refresh rate of the refresh command as the security level increases. In various embodiments of the present disclosure, when the security level is low, the normal refresh command control circuit 330 may adjust the refresh rate of the refresh command according to the temperature of the memory 250. When the security level is high, the normal refresh command control circuit 330 may adjust the refresh rate of the refresh command to the maximum level, regardless of the temperature of the memory 250. Table 1 below summarizes the refresh rate of the refresh command according to the security level.

TABLE 1

| Temperature | Security level 0, 1 | Security level 2, 3 |
| --- | --- | --- |
| Low temperature | Refresh rate is low | Refresh rate is high |
| Medium temperature | Refresh rate is medium | |
| High temperature | Refresh rate is high | |

As the refresh operation is performed more frequently, the defense capability against row hammer attacks may become higher. Therefore, as the security level becomes higher, it may be possible to efficiently defend against row hammer attacks when the refresh rate is raised. The temperature information TEMP_MEM which is input to the normal refresh command control circuit 330 may be received from the memory 250 through the memory interface 221. Since the data retention time of the memory 250 is increased when the temperature is low and the data retention time of the memory 250 is decreased when the temperature is high, adjusting the refresh rate according to the temperature when the security level is low may decrease the amount of current consumed for a refresh operation of the memory 250. The refresh command information REF_CMD may be transferred to the scheduler 213. When the refresh command information REF_CMD is activated, the scheduler 213 may schedule a refresh operation, that is, application of the refresh command.

Figure 4:
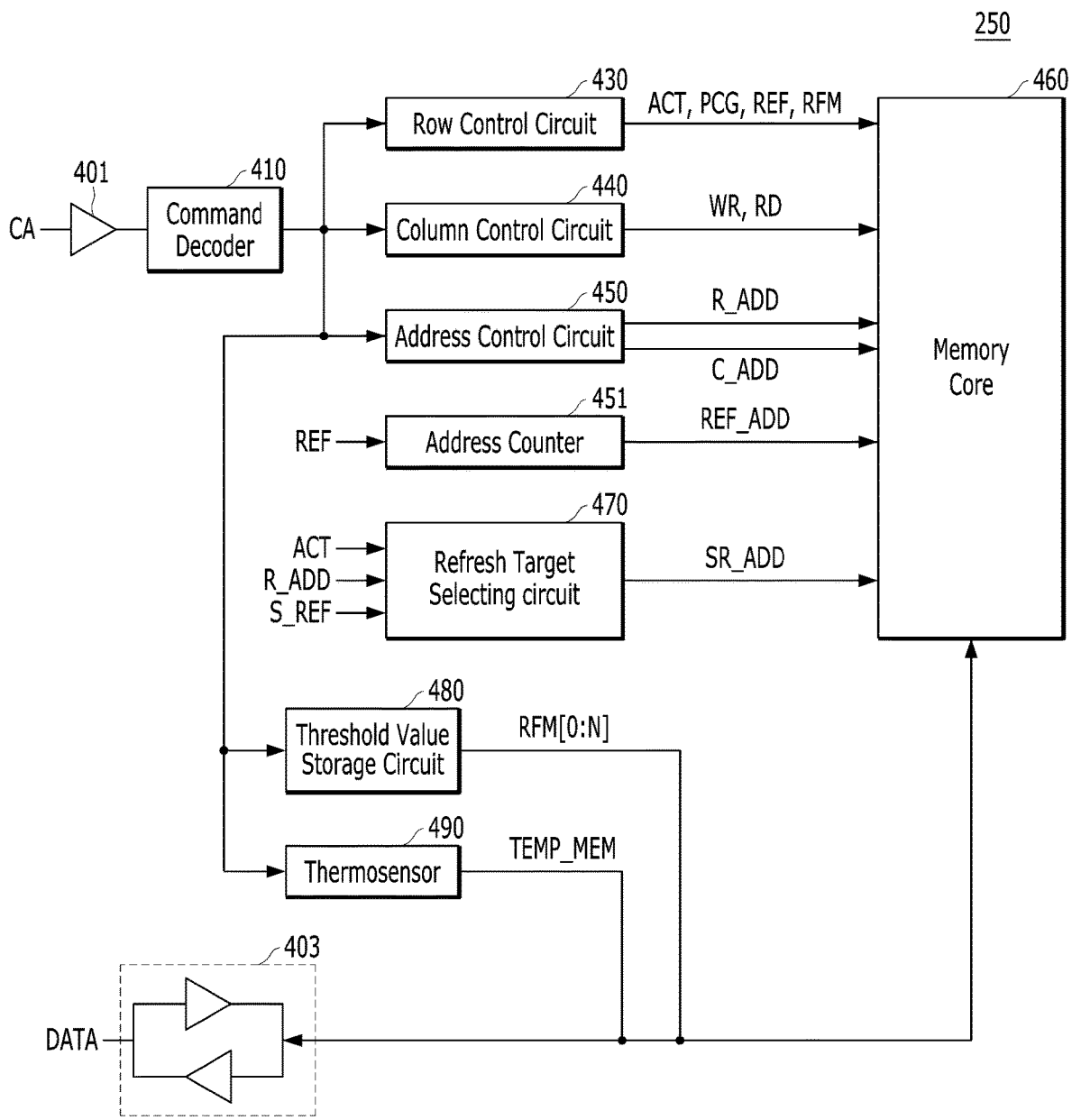
FIG. 4 is a block diagram illustrating a memory shown in FIG. 2 in accordance with an embodiment of the present invention.

FIG. 4 is a block diagram illustrating the memory 250 shown in FIG. 2 in accordance with an embodiment of the present invention.

Referring to FIG. 4, the memory 250 may include a command address receiving circuit 401, a data transferring/receiving circuit 403, a command decoder 410, a row control circuit 430, a column control circuit 440, an address control circuit 450, an address counter 451, a memory core 460, a refresh target selecting circuit 470, a threshold value storage circuit 480, and a thermosensor 490.

The command address receiving circuit 401 may receive a command and an address CA. According to the type of memory 250, a command and an address may be input to the same input terminals, or a command and an address may be input to separate input terminals. Herein, it is illustrated that the command and the address CA are input to the same input terminals. The command and the address CA may be multiple bits.

The data transferring/receiving circuit 403 may receive data DATA or transfer data DATA. The data transferring/receiving circuit 403 may receive the data DATA to be written into the memory core 460 during a write operation and transfer the data DATA read from the memory core 460 during a read operation.

The command decoder 410 may decode the command and the address CA to find out the type of the operation commanded by the memory controller 210 to the memory 250.

As a result of the decoding of the command decoder 410, when a row-based operation, such as an active operation, a precharge operation, a refresh operation, a refresh management operation, etc., is indicated, the row control circuit 430 may control the row-based operation. An active signal ACT may be a signal instructing an active operation. A precharge signal PCG may be a signal instructing a precharge operation. A refresh signal REF may be a signal instructing a refresh operation. The refresh management signal RFM may be a signal instructing a refresh management operation. Herein, the refresh management operation may be an operation for refreshing the row which is selected by the refresh target selecting circuit 470 in order to prevent data loss that may occur due to a row hammer attack. This operation may also be referred to as a smart refresh operation.

As a result of the decoding of the command decoder 410, when a column-based operation, such as a write operation and a column operation, is indicated, the column control circuit 440 may control the column-based operation. A write signal WR may be a signal instructing a write operation. A read signal RD may be a signal instructing a read operation.

The address control circuit 450 may determine the address received from the command decoder 410 as a row address R_ADD or a column address C_ADD and transfer it to the memory core 460. The address control circuit 450 may determine the received address as a row address R_ADD when it is found out as a result of the decoding of the command decoder 410 that an active operation is instructed. The address control circuit 450 may determine the received address as a column address C_ADD when it is found out that read and write operations are instructed.

The address counter 451 may generate a refresh address REF_ADD to be used for a refresh operation. The address counter 451 may increase the refresh address REF_ADD by 1 whenever the refresh signal REF is activated. Since the refresh address REF_ADD is changed whenever the refresh signal REF is activated, the rows of the memory core 460 may be sequentially refreshed.

The refresh target selecting circuit 470 may select a row whose data are highly likely to be lost due to the row hammer attack and provide it to the memory core 460. In various embodiments of the present disclosure, the refresh target selecting circuit 470 may provide, to the memory core 460, the addresses corresponding to the neighboring rows of a row that have been activated excessively many times as smart refresh addresses SR_ADD.

The memory core 460 may perform an operation indicated by the internal command signals ACT, PCG, WR, RD, REF, and RFM. The memory core 460 may include a cell array including memory cells that are arranged in a plurality of rows and a plurality of columns, a row decoder for activating/deactivating a row of the cell array, and a column decoder and input/output circuits for inputting/outputting data to/from the cell array, which are components for such operations as active, precharge, read, write, refresh, and smart refresh operations. When the active signal ACT is activated, a row selected based on the row address R_ADD among the rows of the memory core 460 may be activated. When the precharge signal PCG is activated, the activated row may be deactivated. When the write signal WR is activated, data may be written into columns selected based on the column address C_ADD among the columns of the memory core 460. When the read signal RD is activated, data may be read from the columns selected based on the column address C_ADD among the columns of the memory core 460. When the refresh signal REF is activated, a row selected based on the refresh address REF_ADD among the rows of the memory core 460 may be refreshed. When the refresh management signal RFM is activated, a row selected based on the smart refresh address SR_ADD among the rows of the memory core 460 may be refreshed.

The threshold value storage circuit 480 may receive the security level which is set by the security level setting circuit 310 of the memory controller 410 through the command decoder 410. The threshold value storage circuit 480 may store different threshold values for each security level that reflects the characteristics of the memory 250. Further, the threshold value storage circuit 480 may transfer the threshold value RFM[0:N] corresponding to the security level among the stored threshold values to the memory controller 210 through the data transferring/receiving circuit 403. The refresh management command control circuit 320 of the memory controller 210 may operate based on the threshold value RFM[0:N] transferred from the memory 250.

The thermosensor 490 may sense the temperature of the memory 250. The temperature information TEMP_MEM sensed by the thermosensor 490 may be transferred to the memory controller 210 through the data transferring/receiving circuit 403. The normal refresh command control circuit 330 of the memory controller 210 may operate based on the temperature information TEMP_MEM transferred from the memory 250.

The moment when the threshold value storage circuit 480 transfers the threshold value RFM[0:N] to the memory controller 210 and the moment when the thermosensor 490 transfers the temperature information TEMP_MEM to the memory controller 210 may be controlled by the command decoder 410.

According to an embodiment of the present invention, row hammering attack defense capability of a memory system may be increased.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory controller comprising:
    a security level setting circuit suitable for setting a security level by monitoring a risk of a row hammer attack; and a refresh management command control circuit suitable for controlling the number of times that a refresh management command is to be applied to a memory per unit time according to the security level.

2. The memory controller of claim 1, further comprising:
a normal refresh command control circuit suitable for controlling the number of times that a refresh command is to be applied to the memory per unit time according to the security level.

3. The memory controller of claim 1, wherein the security level setting circuit sets the security level by monitoring at least one of active information, cache miss information, and uncorrectable error information.

4. The memory controller of claim 1, wherein the refresh management command control circuit
controls the number of times that the refresh management command is to be applied to the memory per unit time so that the refresh management command is applied to the memory whenever the number of activations reaches a threshold value, and
wherein the threshold value is adjusted according to the security level.

5. The memory controller of claim 4, wherein the threshold value is received from the memory, and
wherein the threshold value transferred from the memory to the refresh management command control circuit is adjusted according to the security level.

6. The memory controller of claim 2, wherein the normal refresh command control circuit increases the number of times that the refresh command is to be applied to the memory per unit time as the security level becomes higher.

7. The memory controller of claim 2, wherein the normal refresh command control circuit
controls the number of times that the refresh command is to be applied to the memory per unit time according to a temperature of the memory when the security level is low, and
controls the number of times that the refresh command is to be applied to the memory per unit time to a maximal level, regardless of the temperature of the memory, when the security level is high.

8. The memory controller of claim 7, wherein the normal refresh command control circuit receives information about the number of times that the refresh command is to be applied to the memory per unit time according to the temperature of the memory.

9. The memory controller of claim 2, further comprising:
a host interface suitable for communicating with a host;
a scheduler suitable for scheduling an operation of the memory;
a command generator suitable for generating a command to be applied to the memory;
an error correction circuit suitable for correcting an error; and
a memory interface suitable for communicating with the memory.

10. A memory controller comprising:
a security level setting circuit suitable for setting a security level by monitoring a risk of a row hammer attack; and
a normal refresh command control circuit suitable for controlling the number of times that a refresh command is to be applied to a memory per unit time according to the security level.

11. The memory controller of claim 10, wherein the normal refresh command control circuit increases the number of times that the refresh command is to be applied to the memory per unit time, as the security level becomes higher.

12. The memory controller of claim 11, wherein the normal refresh command control circuit
controls the number of times that the refresh command is to be applied to the memory per unit time according to a temperature of the memory when the security level is low, and
controls the number of times that the refresh command is to be applied to the memory per unit time to a maximal level, regardless of the temperature of the memory, when the security level is high.

13. A memory system comprising:
a memory; and
a memory controller suitable for controlling the memory, wherein the memory controller includes:
a security level setting circuit suitable for setting a security level by monitoring a risk of a row hammer attack; and
a refresh management command control circuit suitable for controlling the number of times that a refresh management command is to be applied to the memory per unit time according to the security level.

14. The memory system of claim 13, further comprising:
a normal refresh command control circuit suitable for controlling the number of times that a refresh command is to be applied to the memory per unit time according to the security level.

15. The memory system of claim 13, wherein the security level setting circuit sets the security level by monitoring at least one of active information, cache miss information, and uncorrectable error information.

16. The memory system of claim 13, wherein the refresh management command control circuit
controls the number of times that the refresh management command is applied to the memory per unit time so that the refresh management command is to be applied to the memory whenever the number of activations reaches a threshold value, and
wherein the threshold value is adjusted according to the security level.

17. The memory system of claim 16, wherein the threshold value is transferred from the memory to the refresh management command control circuit, and
wherein the threshold value transferred from the memory to the refresh management command control circuit is adjusted according to the security level.

18. The memory system of claim 14, wherein the normal refresh command control circuit
controls the number of times that the refresh command is to be applied to the memory per unit time according to a temperature of the memory when the security level is low, and
controls the number of times that the refresh command is to be applied to the memory per unit time to a maximal level, regardless of the temperature of the memory, when the security level is high.

19. The memory system of claim 18, wherein the normal refresh command control circuit transfers
information about the number of times that the refresh command is to be applied to the memory per unit time according to the temperature of the memory, to the normal refresh command control circuit.

20. A memory system comprising:
a memory; and
a memory controller suitable for controlling the memory, wherein the memory controller includes:

a security level setting circuit suitable for setting a security level by monitoring a risk of a row hammer attack; and a normal refresh command control circuit suitable for controlling the number of times that a refresh command is to be applied to the memory per unit time according to the security level.

\* \* \* \* \*